United States Patent [19]

Morse et al.

[11] Patent Number: 4,494,033
[45] Date of Patent: Jan. 15, 1985

[54] THIN LEAD SUSPENSION FOR A PIEZOELECTRIC RESONATOR

[75] Inventors: William C. Morse, Newbury; John B. Phaneuf, Haverhill, both of Mass.

[73] Assignee: AT&T Technologies, Inc., New York, N.Y.

[21] Appl. No.: 478,934

[22] Filed: Mar. 25, 1983

[51] Int. Cl.³ .............................................. H01L 41/08
[52] U.S. Cl. .................................... 310/352; 310/351
[58] Field of Search ............................... 310/351–353, 310/348

[56] References Cited

U.S. PATENT DOCUMENTS

| 2,441,139 | 5/1948 | Fair | 310/352 |
| 2,597,797 | 5/1952 | Holmbeck | 310/352 X |
| 3,017,525 | 1/1962 | Wolfskill | 310/352 |
| 3,612,922 | 10/1971 | Furnival | 310/351 |

FOREIGN PATENT DOCUMENTS 2314901 10/1973 Fed. Rep. of Germany ...... 310/352

Primary Examiner—Mark O. Budd
Attorney, Agent, or Firm—D. D. Bosben

[57] ABSTRACT

A mini-oscillator assembly (20) is formed by initially bonding ribbon leads (34) to contact pads (32) on a planar substrate (26) of a hybrid integrated circuit device (22) such that the leads project from the substrate in the plane thereof. Inverted V-shaped notches (50) then are formed in the ribbon leads (34) as the leads are cut to length. The ribbon leads (34) then are formed over the substrate (26) so that the V-shaped notches (50) face away from the substrate (26) and are aligned with one another on opposite sides of a plane extending from an imaginary line (52) extending between and interconnecting the substrate contact pads (32). Wire leads (38) of a crystal resonator plate (24) then are soldered in the V-shaped notches (50) to form the mini-oscillator assembly (20).

11 Claims, 12 Drawing Figures

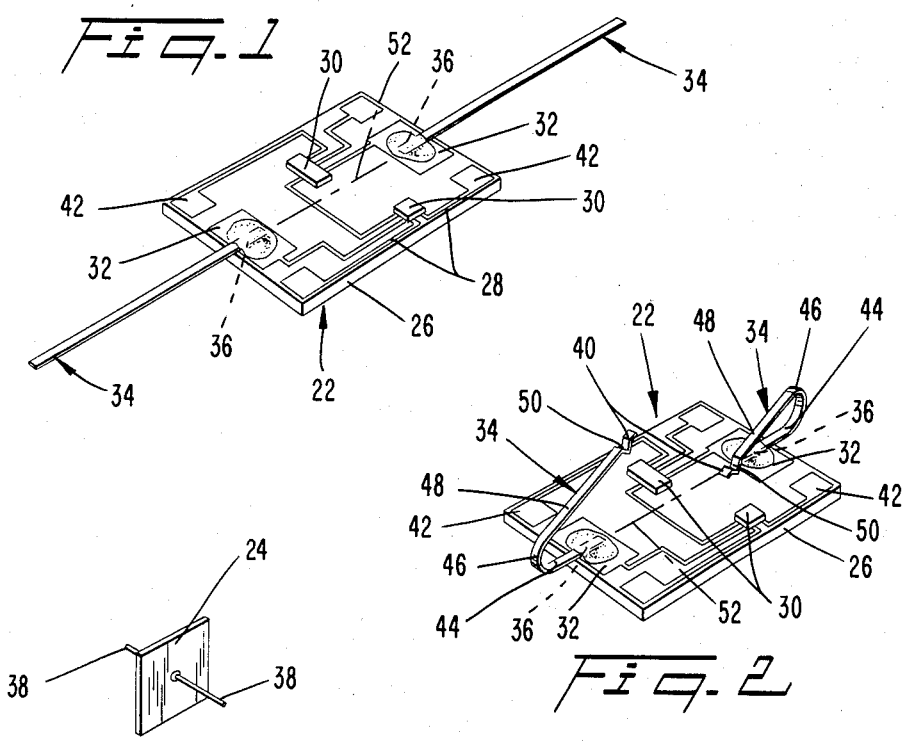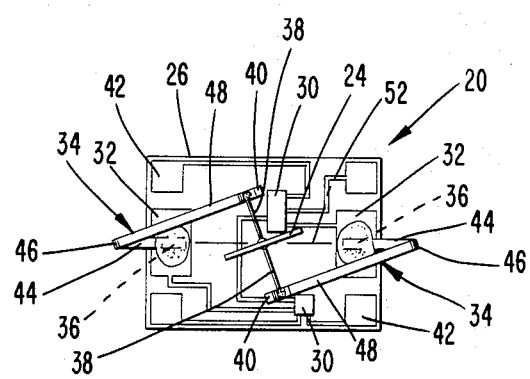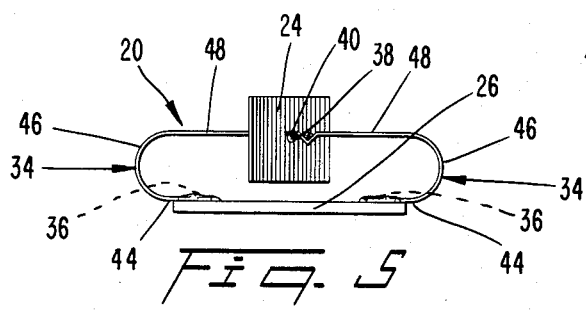

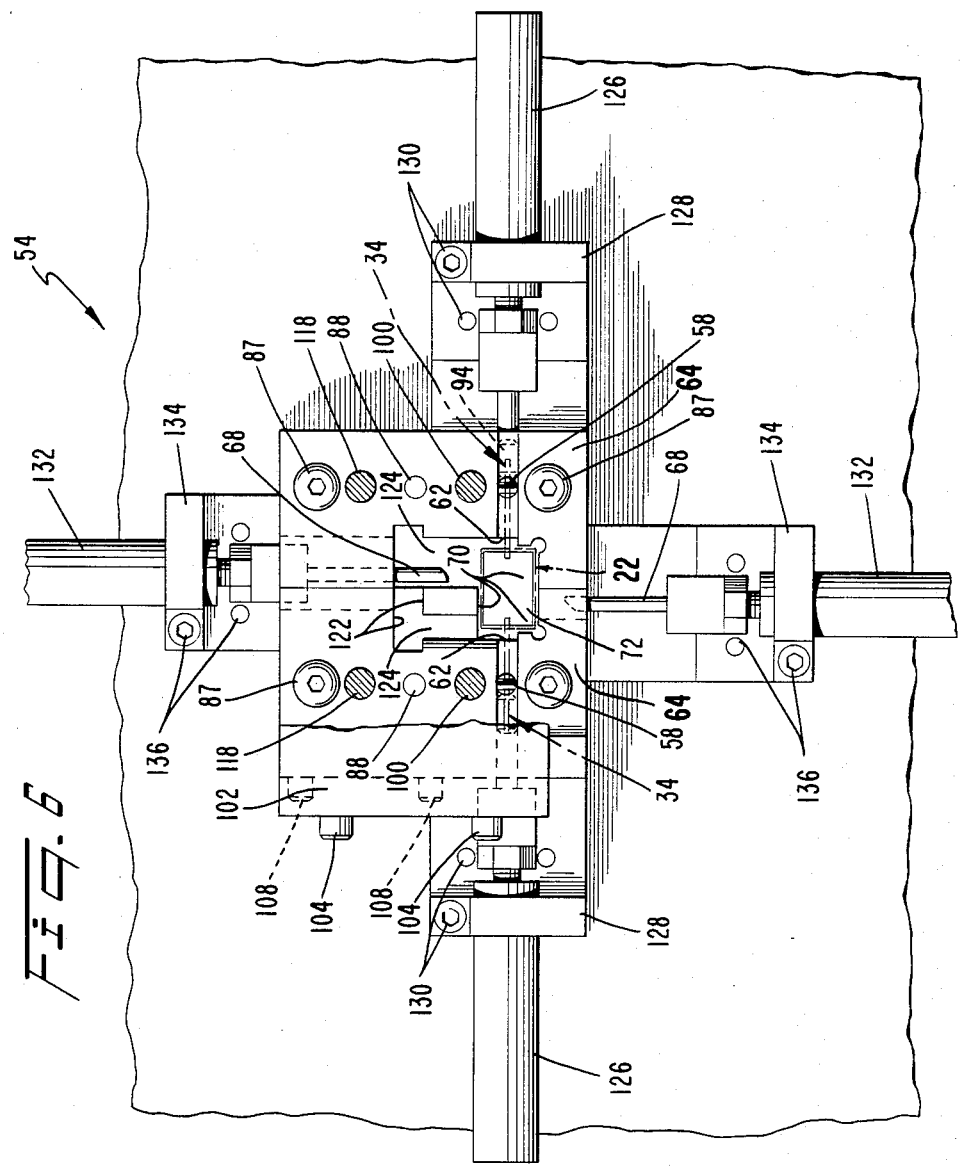

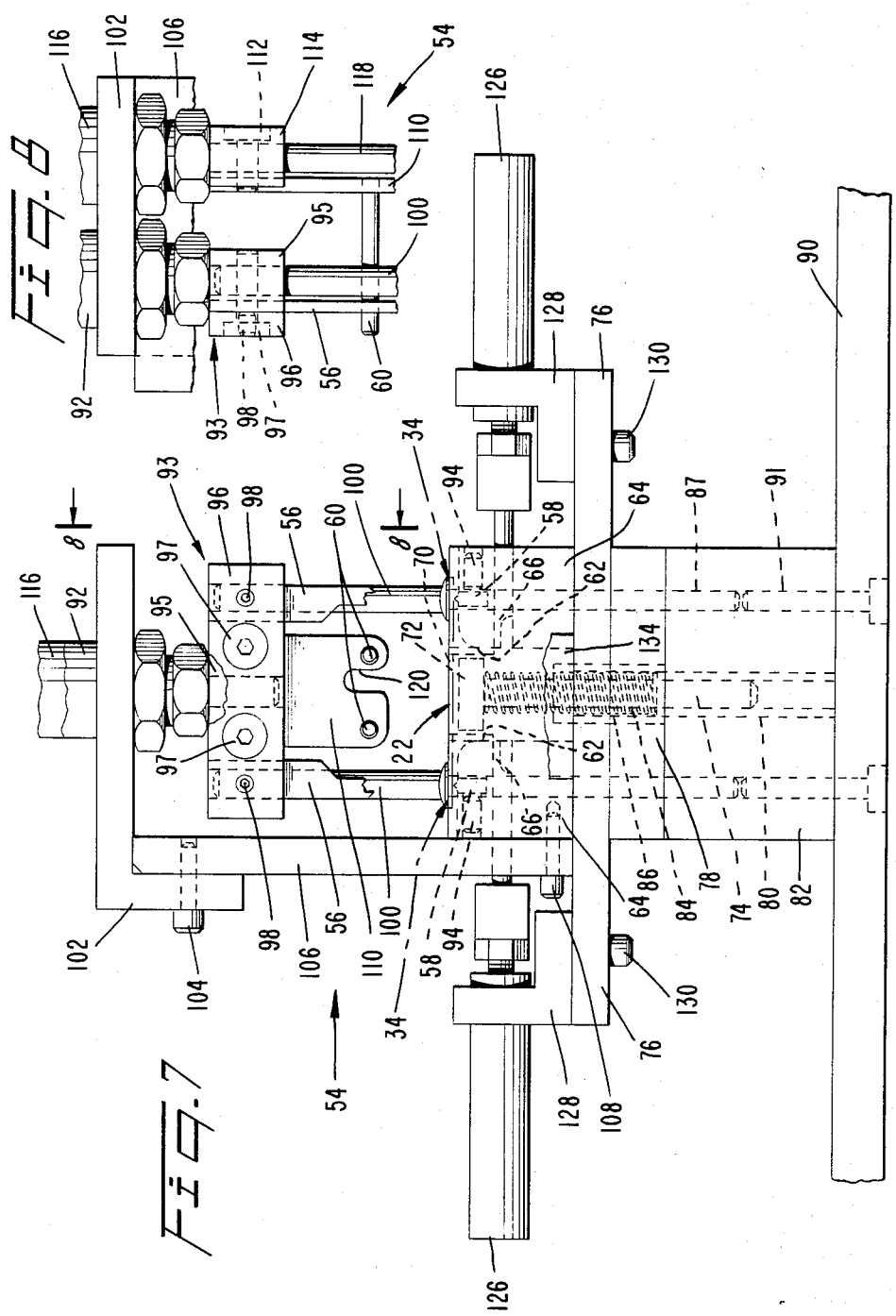

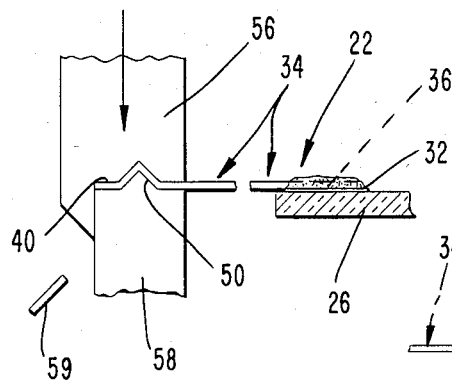
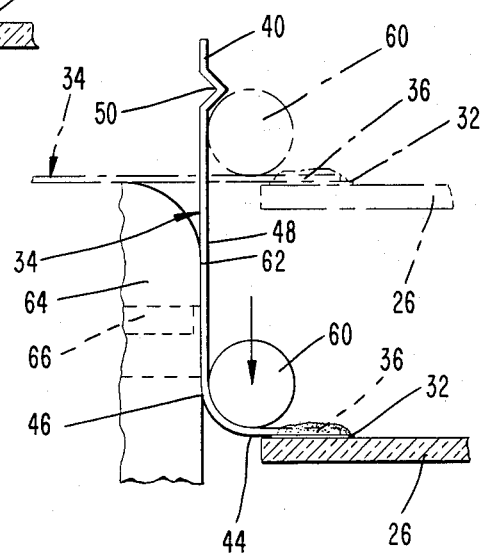
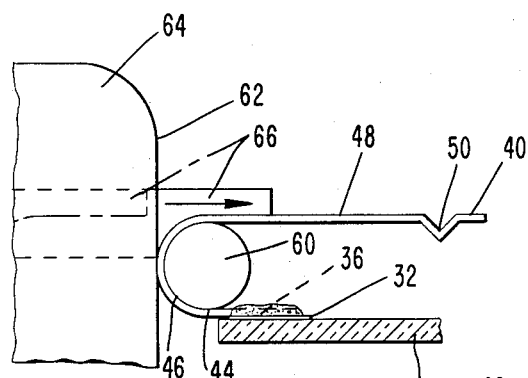
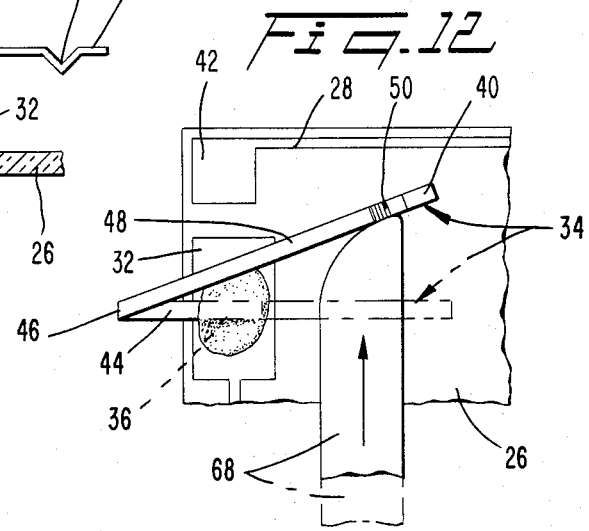

THIN LEAD SUSPENSION FOR A PIEZOELECTRIC RESONATOR

TECHNICAL FIELD

This invention relates to an electrical assembly and a method of and apparatus for forming the assembly, and more particularly to a mini-oscillator comprising a crystal resonator plate mounted in a novel manner on a substrate, and a method of and apparatus for forming the mini-oscillator.

BACKGROUND OF THE INVENTION

A known mini-oscillator for use in communications transmission equipment comprises a crystal resonator plate having wire leads projecting from respective opposite planar surfaces of the plate. The crystal resonator plate is mounted on a substrate of an integrated circuit device by bonding the leads of the plate to upwardly extending leads on the substrate. For example, in a mounting arrangement which has been used previously, inner ends of ribbon leads are bonded to contact pads on the substrate such that the leads project from opposite sides of the substrate in the plane of the substrate. The leads then are bent upward manually into vertical positions extending perpendicular to the substrate and twisted 90° along their length such that preformed V-shaped notches in outer end portions of the leads are in aligned parallel relationship. Outer end portions of the crystal resonator plate wire leads then are manually positioned and held in place in the V-shaped notches of the vertically extending ribbon leads, and are soldered to the ribbon leads.

The above-described prior mounting arrangement, wherein the leads of the substrate are formed manually into twisted vertically extending positions, is relatively slow and inefficient, and therefore not suitable where large production volumes are involved. Further, the leads of the crystal resonator plate cannot readily be retained and soldered into the notches in the vertically extending substrate leads in a progressive assembly-type apparatus. Accordingly, a purpose of this invention is to provide a new and improved mini-osicillator assembly, and a new and improved method of and apparatus for forming the assembly.

SUMMARY OF THE INVENTION

In general, a first electrical device comprises a substrate having spaced contact pads formed on the substrate. The first electrical device also includes leads which have inner ends secured to respective ones of the contact pads on the substrate. First portions of the leads extend away from the contact pads in a direction essentially perpendicular to the substrate and second portions of the leads extend in spaced opposed relationship to the substrate and terminate in outer free end portions. A second electrical device has projecting leads secured to the outer free end portions of the leads of the first electrical device.

More specifically, the outer free end portions of the leads of the first electrical device are located in spaced opposed relationship to the substrate on opposite sides of a plane extending from an imaginary line interconnecting the contact pads on the substrate. The outer free end portions of the leads of the first electrical device also have aligned, transversely extending notches formed in surfaces of the leads which face away from the substrate, and the leads of the second electrical device are disposed in respective ones of the aligned, transversely extending notches. The leads of the first electrical device are ribbon type leads, with the first portions of the leads being of arcuate construction and the second portions of the leads being of linear construction. Further, the second electrical device is a crystal resonator plate and the leads thereof are of wire construction.

In forming the first electrical device, the leads of the device may be bonded to the contact pads on the substrate such that the leads initially project from the contact pads in the plane of the substrate. Notches for receiving the leads of the second electrical device then may be formed in outer free end portions of the leads of the first electrical device. First portions of the leads of the first electrical device then are bent out of the plane of the substrate in a direction extending essentially perpendicular to the plane of the substrate. Second portions of the leads then are bent relative to the first lead portions into spaced opposed relationship to the substrate and such that the lead-receiving notches in the outer free end portions of the leads face away from the substrate. The second portions of the leads then may be further bent laterally parallel to the substrate such that the outer free end portions of the leads are on opposite sides of a plane extending from an imaginary line interconnecting the contact pads on the substrate. After the second portions of the leads have been bent into their final positions, the leads of the second electrical device are positioned in the notches in the leads of the first electrical device and secured thereto.

BRIEF DESCRIPTION OF THE DRAWING

FIG. 1 is an isometric view of an electrical substrate circuit device in an initial stage of fabrication in accordance with the invention;

FIG. 2 isometric view of the electrical substrate circuit device of FIG. 1 in a subsequent stage of fabrication in accordance with the invention;

FIG. 3 is an isometric view of a crystal resonator plate;

FIG. 4 is a plan view of a mini-oscillator assembly formed by mounting the crystal resonator plate of FIG. 3 on the electrical substrate circuit device as shown in FIG. 2;

FIG. 5 is an elevational view of the mini-oscillator assembly shown in FIG. 4.

FIG. 6 is a plan view, partially broken away, of an apparatus for fabricating the invention;

FIG. 7 is an elevational view, partially broken away, of the apparatus shown in FIG. 6;

FIG. 8 is a partial side elevational view of the apparatus as viewed along the line 8—8 in FIG. 7; and FIGS. 9, 10, 11, and 12 are enlarged schematic views illustrating sequential steps in the operation of the apparatus shown in FIGS. 6 and 7.

DETAILED DESCRIPTION

A mini-oscillator assembly 20 (FIGS. 4 and 5) in accordance with the invention includes a first electrical device in the form of a hybrid integrated circuit device 22 (FIG. 2) and a second electrical device in the form of a crystal resonator plate 24 (FIG. 3) mounted on the hybrid integrated circuit device. The hybrid integrated circuit device 22 includes a ceramic substrate 26 comprising suitable thin film circuits 28 (FIG. 1) and having one or more integrated circuit chip devices 30 mounted thereon. A pair of spaced contact pads 32 are formed at opposite ends of the substrate 26 and a pair of unitary ribbon leads 34 have inner ends 36 secured to respective ones of the contact pads, such as by soldering. The crystal resonator plate 24 (FIG. 3) has wire leads 38 projecting from opposite sides of the plate and mounted on outer free end portions 40 of respective ones of the ribbon leads 34, as shown in FIGS. 4 and 5. The substrate 26 also includes contact pads 42 formed at respective corners of the substrate for connection to leads of a housing (not shown) in a subsequent manufacturing operation.

More specifically, in the mini-oscillator assembly 20 shown in FIGS. 4 and 5, inner end portions 44 of the ribbon leads 34 extend in opposite directions essentially parallel to the substrate 26 and merge into arcuate reverse-bent first intermediate lead portions 46 which extend away from the contact pads 32 in a direction essentially perpendicular to the substrate 26. The arcuate portions 46 of the ribbon leads 34 merge into planar second intermediate lead portions 48 which extend in spaced opposed parallel relationship to the substrate 26 and which merge into the outer free end portions 40 of the ribbon leads. The outer free end portions 40 of the ribbon leads 34 are formed with transversely extending notches 50 (best shown in FIG. 2) which face away from the substrate 26 to define nests in which the wire leads 38 of the crystal resonator plate 24 are received and secured by soldering. In this connection, the second intermediate ribbon lead portions 48 are bent transversely in opposite directions from adjacent their respective arcuate lead portions 46 so as to be located on opposite sides of a plane extending from an imaginary centerline 52 of the substrate extending between and interconnecting the contact pads 32, whereby the transversely extending notches 50 in the outer free end portions 40 of the ribbon leads 34 are aligned with one another for receiving the wire leads 38 of the crystal resonator plate 24.

In general, the fabricating of the mini-oscillator assembly 20 of FIGS. 4 and 5 in accordance with this invention may be accomplished by initially securing (e.g., soldering) the inner ends 36 of the ribbon leads 34 to the contact pads 32 on the substrate 26 so that the ribbon leads project from opposite ends of the substrate essentially in the plane of the substrate, as shown in FIG. 1. The hybrid integrated circuit device 22 then is positioned in an apparatus 54 shown in FIGS. 6, 7 and 8. In the apparatus 54, referring to FIG. 9, each ribbon lead 34 of the device 22 initially is sheared to length and the transversely extending notch 50 of the lead is formed in the resultant outer free end portion 40 of the lead by a respective set of opposed upper and lower shearing-forming blades 56 and 58, respectively. A scrap segment 59 which is sheared from the outer end portion 40 of the ribbon lead 34 drops by gravity into a suitable receptacle, not shown.

As is illustrated in FIG. 10, the first intermediate portion 46 of each ribbon lead 34 then is formed with an arcuate 90° bend so that the lead outer free end portion 40 and the second lead intermediate portion 48 extend vertically, by a respective one of a pair of vertically movable cylindrical anvil pins 60 (only one shown in FIG. 10) and a forming surface 62 of a respective one of a pair of fixed die blocks 64 (only one shown in FIG. 10). Referring to FIG. 11, an associated one of a pair of horizontally movable forming bars 66 then advances to bend the first intermediate portion 46 of the ribbon lead 34 an additional 90° about the anvil pin 60 to complete the forming of the first intermediate lead portion into an arcuate reverse-bent configuration and to locate the lead outer free end portion 40 and the second lead intermediate portion 48 in spaced opposed parallel relationship to the substrate 26.

The outer free end portion 40 and the second intermediate portion 48 of each ribbon lead 34 then are bent transversely parallel to the substrate 26 relative to the arcuate lead portion 46, from a broken line position to a solid line position as shown in FIG. 12, by a respective one of a pair of horizontally movable bending rods 68 (only one shown in FIG. 12), to complete forming of the hybrid integrated circuit device 22 as shown in FIG. 2. The hybrid integrated circuit device 22 then is removed from the apparatus 54 and the wire leads 38 of the crystal resonator plate 24 are secured in the notches 50 in the outer free end portions 40 of the ribbon leads 34 as shown in FIGS. 4 and 5, in a separate step, not shown, thus completing the fabrication of the mini-oscillator assembly 20.

More specifically, referring to FIGS. 6 and 7, the integrated circuit device 22, as shown in FIG. 1, is positioned in the apparatus 54 in a nest 70 defined by opposed portions of the die blocks 64. The integrated circuit device 22 is supported in the nest 70 on a vertically movable support member 72 with the projecting ribbon leads 34 disposed between respective ones of the upper and lower shearing-forming blades 56 (shown only in FIG. 7) and 58, respectively.

The nest support member 72 is disposed for vertical movement in a vertical guideway defined by a pair of opposed slots formed in respective ones of the die blocks 64. As is best shown in FIG. 7, the nest support member 72 is fixedly mounted on an upper end of a vertical plunger 74 extending through an air cylinder support plate 76 and an intermediate support block 78, and having a lower end portion slidably mounted in a bushing 80 in a base block 82. The nest support member 72 and the plunger 74 are biased to an upper position as shown in FIG. 7 by a coil spring 84 encircling the plunger between the nest support member and an upper end of the bushing 80. The coil spring 84 is partially disposed in a cylindrical sleeve 86 mounted in the air cylinder support plate 76 and the intermediate support block 78. The die blocks 64, air cylinder support plate 76, intermediate support block 78 and base block 82 are secured together by screws 87 and aligning dowels 88 (FIG. 6). The base block 82 is secured to a horizontal base plate 90 by screws 91.

After the integrated circuit device 22 has been positioned on the nest support member 70, the upper shearing-forming blades 56 are moved downward by the operation of an upper front air cylinder 92 (FIGS. 7 and 8), and cooperate with the lower shearing-forming blades 58 (FIGS. 6 and 7) to shear the ribbon leads 34 to length and to form the transversely-extending notches 50 in the leads as above described. Upper ends of the upper shearing-forming blades 56 are mounted in opposite end portions of a front horizontal support bar assembly 93 (FIGS. 7 and 8) supported on a lower end of a piston rod of the first air cylinder 92. The lower shearing-forming blades 58 are fixedly mounted in recesses in respective ones of the die blocks 64 by set screws 94.

More specifically, the support bar assembly 93 includes two bar members 95 and 96 (FIGS. 7 and 8) secured together by screws 97. The bar member 95 is screw-threadably mounted on the piston rod of the air cylinder 92 as illustrated in FIG. 7, and the blades 56 are secured in vertical slots in the bar member 95 by set screws 98 in the bar member 96. The bar member 95 is guided for vertical movement by a front pair of upstanding guide pins 100 having lower end portions mounted in respective ones of the die blocks 64 and having upper end portions slidably received in suitable bushings (not shown) in the bar member. The front upper air cylinder 92 is mounted on a horizontal arm of a bracket 102 secured by screws 104 to a vertical support plate 106. A lower end of the vertical support plate 106 is secured by screws 108 (FIGS. 6 and 7) to the adjacent die block 64.

Referring to FIGS. 7 and 8, each of the cylindrical anvil pins 60 is screw-threadably mounted at one end in a vertically movable support plate 110 adjacent a lower end of the support plate and projects forwardly from the support plate in cantilever fashion so as to have an outer free end. As is best shown in FIG. 8, an upper end of the support plate 110 is secured by screws 112 to a horizontal rear support bar 114 screw-threadably mounted on a lower end of a piston rod of an upper rearward air cylinder 116. The air cylinder 116 is mounted on the horizontal arm of the mounting bracket 102 behind the upper front air cylinder 92. The support bar 114 is guided for vertical movement by a rear pair of upstanding guide pins 118 (only one shown in FIG. 8) similar to the guide pins 100 for the front bar assembly 93. The lower end of the support plate 110 is formed with a vertically extending slot 120 (FIG. 7) so that the support plate can straddle one of the lead-bending rods 68 (FIG. 6) which is located therebeneath as the support plate moves downward in a lead-forming operation.

After the upper shearing-forming blades 56 have been retracted upward by the upper front air cylinder 92, the upper rear air cylinder 116 is operated to move the support plate 110 and the anvil pins 60 thereon downward to form a 90° bend in the ribbon leads 34 of the integrated circuit device 22 as shown in FIG. 10. In this connection, the support plate 110 moves downward in a guide slot 122 (best shown in FIG. 6) defined by inner vertical surfaces of the die blocks 64, and the cantilevered anvil pins 60 move downward in respective openings 124 (best shown in FIG. 6) extending vertically through the die blocks. As the support plate 110 and the cantilevered anvil pins 60 move downward, forward end portions of the anvil pins engage the inner end portions 44 (FIG. 10) of the ribbon leads 34 of the integrated circuit device 22 to move the leads and the device downward against the upward biasing action of the spring-loaded nest support member 72. At the same time, the anvil pins 60 cooperate with the die forming surfaces 62 of the die blocks 64 to bend the ribbon leads 34 upward 90° as shown in FIG. 10.

Referring to FIGS. 6 and 7, air cylinders 126 at opposite sides of the apparatus 54 next are energized to advance the forming bars 66 to bend the ribbon leads 34 about the anvil pins 60 an additional 90° as shown in FIG. 11, and then are de-energized to return the forming bars to their initial positions. The air cylinders 126 are mounted by brackets 128 and screws 130 on oppositely extending integral arms of the air cylinder support plate 76. The forming bars 66 are mounted for sliding movement in suitable guideways in respective ones of the die blocks 64.

The lead bending rods 68 are mounted on piston rods of respective front and rear air cylinders 132, which are best shown in FIG. 6. As in the case of the air cylinders 126, the air cylinders 132 are mounted by brackets 134 and screws 136 on front and rear integral arms of the air cylinder support plate 76.

After the lead forming bars 66 have been retracted by the air cylinders 126, the air cylinders 132 are operated to advance the bending rods 68 in opposite directions to bend the outer free end portions 40 and the second intermediate portions 48 of the ribbon leads 34 relative to the arcuate first intermediate portions 46 of the leads, as illustrated in FIG. 12. The air cylinders 132 then are de-energized to retract the bending rods 68, and the upper rearward air cylinder 116 is operated to move the support plate 110 and the anvil pins 60 thereon upward to their initial positions, with the integrated circuit device 22 being supported on the anvil pins by the formed ribbon leads 34 and thus moving upward with the anvil pins. The integrated circuit device 22 then can be removed from the anvil pins 60 off the outer (forward) free ends thereof for additional processing, including the mounting of the leads 38 of the crystal resonator plate 24 (FIG. 3) in the aligned notches 50 in the ribbon leads 34 in a separate operation as described hereinabove.

The sequential operation of the air cylinders 92, 116, 126 and 132 of the apparatus 54 to accomplish the various forming operations described hereinabove may be accomplished in any suitable manner. For example, the sequencing of the air cylinders 92, 116, 126 and 132 may be accomplished by a system of air valves and a bank of associated sequencing cams, not shown.

In summary, a new and improved mini-oscillator assembly 20, and a method and apparatus for forming the assembly, has been disclosed. In this connection, initially the inner ends 36 of the ribbon leads 34 are bonded to the contact pads 32 of the substrate 26 of the hybrid integrated circuit device 22 such that the leads project from opposite ends of the substrate in the plane of the substrate as shown in FIG. 1. The hybrid integrated circuit device 22 then is positioned in the apparatus 54, in which the ribbon leads 34 are cut to length and the V-shaped notches 50 are formed in the outer free end portions 40 of the leads by the shearing-forming blades 56 and 58, as shown in FIG. 9. The first intermediate portions 46 of the ribbon leads 34 then are bent 90° relative to the inner end portions 44 of the leads by downward movement of the cylindrical cantilevered anvil pins 60 relative to the die block forming surfaces 62 such that the outer free end portions 40 and the second intermediate portions 48 of the leads project vertically upward, as shown in FIG. 10. The first intermediate portions 46 of the ribbon leads then are bent an additional 90° about the anvil pins 60 by advancement of the forming bars 66, as shown in FIG. 11, to position the outer free end portions and the second intermediate portions of the leads parallel to the substrate 26 with the transverse notches 50 in the outer free end portions facing upward away from the substrate. Thereafter, the outer free end lead portions 40 and the second intermediate lead portions 46 are bent transversely in opposite directions parallel to the substrate 26 by the bending rods 68, to align the transverse notches 50 in the outer free end portions as shown in FIG. 12. Subsequently, the wire leads 38 of the crystal resonator plate 24 are secured in the aligned notches 50 in a separate operation (not shown) to complete the forming of the mini-oscillator assembly 20 as shown in FIGS. 4 and 5.

What is claimed is:

1. A first electrical device for supporting a second electrical device, which comprises:

a substrate having a pair of spaced contact pads formed on the substrate in a plane of the substrate adjacent opposite edges of the substrate; and a pair of unitary leads having inner end portions bonded to respective ones of the contact pads on the substrate so as to extend essentially in the plane of the substrate;

each of the pair of unitary leads further including a reverse-bent first intermediate portion extending from the inner end portion of the lead outward beyond an adjacent one of the edges of the substrate and also projecting in a direction essentially perpendicular to the substrate out of the plane of the substrate;

each of the pair of unitary leads also including a second intermediate portion extending from the reverse-bent first intermediate portion of the lead in spaced opposed relationship to the substrate and terminating in an outer free end portion of the lead; and the second intermediate portions of the unitary leads being bent transversely with respect to the first intermediate portions of the leads in opposite directions essentially parallel to the substrate such that the second intermediate portions and the outer free end portions of the leads are disposed on respective opposite sides of a plane extending from an imaginary line interconnecting the contact pads on the substrate, and such that the second intermediate portions of the leads extend essentially parallel to one another with the outer free end portions of the leads in opposed spaced relationship for the reception of the second electrical device therebetween.

2. An electrical device as recited in claim 1, in which: the opposed spaced outer free end portions of the leads are formed with aligned notches which face away from the substrate for receiving leads of the second electrical device, the notches extending transversely across the outer free end portions of the leads in spaced relationship to outer ends of the leads and parallel to the substrate.

3. An electrical device as recited in claim 2, in which: the first intermediate portions of the leads are of arcuate construction, and the inner end portions of the leads and the second intermediate portions of the leads are of essentially linear construction.

4. An electrical device as recited in claim 1, in which: the inner end portions of the leads also extend outward beyond the edges of the substrate essentially of the plane of the substrate along extensions of the imaginary line interconnecting the contact pads on the substrate.

5. An electrical assembly, which comprises a substrate having spaced contact pads formed on the substrate in a plane of the substrate adjacent opposite ends of the substrate;

a pair of unitary leads having inner end portions bonded to respective ones of the contact pads on the substrate so as to extend essentially in the plane of the substrate;

each of the pair of unitary leads further including a reverse-bent first intermediate portion extending from the inner end portion of the lead outward beyond an adjacent one of the edges of the substrate and also projecting in a direction essentially perpendicular to the substrate and out of the plane of the substrate;

each of the pair of unitary leads also including a second intermediate portion extending from the reverse-bent first intermediate portion of the lead in spaced opposed relationship to the substrate and terminating in an outer free end portion of the lead; and the second intermediate portions of the unitary leads being bent transversely with respect to the first intermediate portions of the leads in opposite directions essentially parallel to the substrate such that the second intermediate portions and the outer free end portions of the leads are disposed on respective opposite sides of a plane extending from an imaginary line interconnecting the contact pads on the substrate, and such that the second intermediate portions of the leads extend essentially parallel to one another with the outer free end portions of the leads in opposed spaced relationship; and an electrical device located between the opposed spaced outer free end portions of the unitary leads and having leads which extend transversely across and which are mounted on the opposed spaced outer free end portions of the unitary leads.

6. An electrical assembly as recited in claim 5, in which:

the opposed spaced outer free end portions of the leads on the substrate are formed with aligned notches which face away from the substrate and which extend transversely across the outer free end portions of the leads in spaced relationship to outer ends of the leads and parallel to the substrate; and outer free end portions of leads of the electrical device are disposed in respective ones of the transversely-extending aligned notches.

7. An electrical assembly as recited in claim 6, in which:

the reverse-bent first intermediate portions of the leads on the substrate are of arcuate construction, and the inner end portions and the second intermediate portions of the leads on the substrate are of essentially linear construction.

8. An electrical assembly as recited in claim 7, in which:

the leads on the substrate are of ribbon construction; and the leads of the electrical device are of wire construction and are mounted in the transversely-extending aligned notches formed in the outer free end portions of the ribbon leads.

9. An electrical assembly as recited in claim 8, in which: the electrical device is a crystal resonator plate.

10. An electrical assembly, as recited in claim 5, in which:

the inner end portions of the leads also extend beyond the edges of the substrate essentially of the plane of the substrate along extensions of the imaginary line interconnecting the contact pads on the substrate.

11. An electrical assembly as recited in claim 10, in which:

the leads on the substrate are of ribbon construction;

the outer free end portions of the ribbon leads on the substrate are formed with aligned notches which face away from the substrate and which extend transversely across the outer free end portions of the ribbon leads in spaced relationship to outer ends of the leads and parallel to the substrate; and the electrical device is a crystal plate extending perpendicular to the substrate and parallel to the second intermediate portions of the leads and the outer free end portions of the leads; and the crystal plate has leads of wire construction extending perpendicularly from the crystal plate and mounted in the transversely-extending aligned notches in the ribbon leads.

* * * * *